United States Patent [19]

Itoh

[11] Patent Number: 5,345,121

[45] Date of Patent: Sep. 6, 1994

[54] DIFFERENTIAL AMPLIFICATION CIRCUIT

[75] Inventor: Eisaku Itoh, Kasugai, Japan

[73] Assignees: Fujitsu Limited, Kawasaki; Fukitsu VLSI Limited, Kasugai, both of Japan

[21] Appl. No.: 24,291

[22] Filed: Mar. 1, 1993

[30] Foreign Application Priority Data

Feb. 27, 1992 [JP] Japan .................................. 4-416900

[51] Int. Cl.[5] ........................... H03K 3/26; H03K 5/22
[52] U.S. Cl. .................................... 307/530; 307/355; 307/279
[58] Field of Search ......................... 307/530, 355, 279

[56] References Cited

U.S. PATENT DOCUMENTS

5,196,737  3/1993  Olmstead .............................. 307/355

Primary Examiner—Margaret Rose Wambach
Attorney, Agent, or Firm—Staas & Halsey

[57] ABSTRACT

The sources of first and second N-channel MOS transistors are interconnected. A complementary input signal is inputted to the gates of the first and second N-channel MOS transistors, and a complementary output signal is outputted from their drains. Switch circuits are respectively connected between the source of the first or the second N-channel MOS transistors, and the interconnected sources of the first and second N-channel MOS transistors. Each switch circuit differs from the N-channel MOS transistor to which the switch circuit is connected. The opening and closing operations of the switch circuit are controlled, based on a complementary signal from the respective MOS transistor.

12 Claims, 6 Drawing Sheets

DIFFERENTIAL AMPLIFICATION CIRCUIT

BACKGROUND OF THE INVENTION

Field of the Invention

The present invention relates to a differential amplification circuit. More specifically, the present invention pertains to a differential amplification circuit used in a semiconductor memory device which is suitable for a sense amplifier.

Description of the Related Art

Recently, a semiconductor memory device, which can perform high speed operation and reduce power consumption, is in high demand. Therefore, it would be desirable to minimize the power consumption which effects the high speed operation of the semiconductor memory device.

In a conventional semiconductor memory device, for example, in a static RAM, data stored in a memory cell is outputted into a sense amplifier, via bit lines, and is amplified by that sense amplifier. A latch type sense amplifier or a current mirror type sense amplifier, etc., can be employed as a sense amplifier. A differential amplification circuit is employed in these sense amplifiers.

Figure 8:
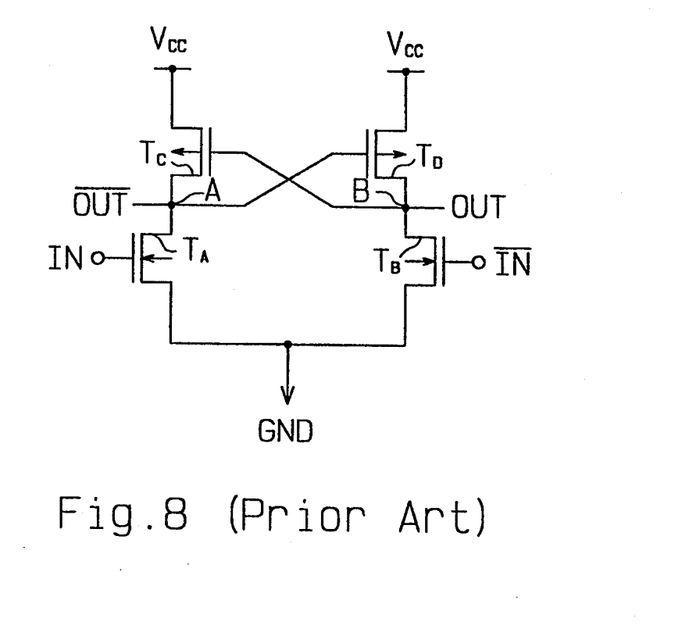
FIG. 8 is a circuit diagram of a conventional latch type sense amplifier.

FIG. 8 shows a conventional latch type sense amplifier. This sense amplifier is a PMOS cross coupled type. This sense amplifier includes a pair of enhancement mode N-channel MOS transistors (hereinafter, referred to as NMOS transistor) TA and TB, and a pair of enhancement mode P-channel MOS transistors (hereinafter, referred to as PMOS) TC and TD. The sources of the NOMOS transistors TA and TB are mutually connected, and further are connected to a low voltage power source GND. Each drain of the NMOS transistors TA and TB is connected to a drain of the PMOS transistors TC and TD, respectively.

On the other hand, the gates of the paired PMOS transistors TC and TD are mutually cross-coupled to the drains of the paired PMOS transistors TD and TC, respectively. Each source of the transistors TC and TD is connected to a high voltage power source Vcc.

In this sense amplifier, complementary input signals IN and bar IN via paired complementary bits lines are inputted into the gate of each NMOS transistor TA and TB. Amplified complementary output signals OUT and $\overline{OUT}$ (hereinafter, referred to as bar OUT) are outputted from each node A and B. For example, when the input signal IN having low electric potential is inputted into the gate of the NMOS transistor TA, and an input signal $\overline{IN}$ (hereinafter, referred to as bar IN) having high electric potential is inputted into the gate of the NMOS transistor TB, both NMOS transistors TA and TB thus become conductive. When a lower voltage than that of the power source Vcc is applied to the gates of the PMOS transistors TC and TD, both PMOS transistors TC and TD become conductive.

Figure 9:
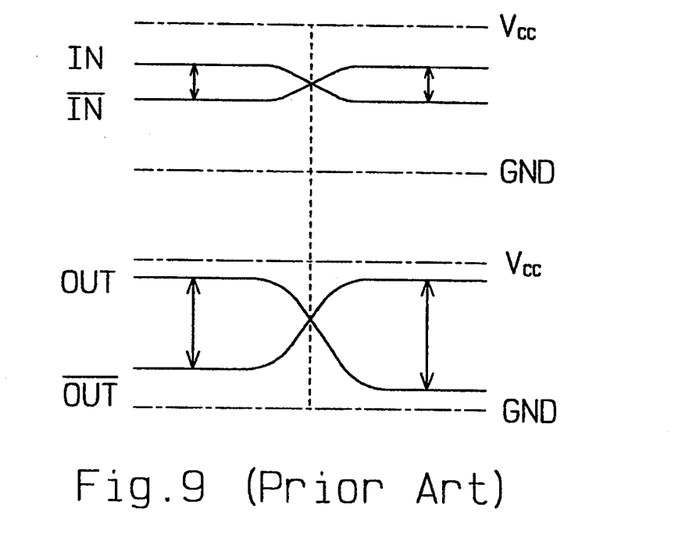
FIG. 9 illustrates input and output wave shapes from the latch type sense amplifier of FIG. 8.

At this time, since the electric potential of the input signal IN is lower than that of the input signal bar IN, conductance of the NMOS transistor TA becomes smaller than that of NMOS transistor TA. As a result, electric potential of the voltage (complementary output signal) OUT of a drain (node A) of the NMOS transistor TA becomes higher than that of the voltage (complementary output signal) of the drain (node B) of the NMOS transistor TB. As shown in FIG. 9, the output signals OUT and bar OUT having electric potential difference therebetween are outputted in relation to the input signals IN and bar IN.

However, in this conventional sense amplifier, each one of the MOS transistors TA through TD becomes simultaneously conductive, and current continuously flows between the high voltage power source Vcc and the low voltage power source GND. Therefore, the sense amplifier consumes a large amount of electricity.

The electric potential between the input signals IN and bar IN is small. Further, as the electric potential difference between the input signals IN and bar IN becomes higher than the threshold voltage of the NMOS transistors TA and TB, both transistors TA and TB become conductive. Consequently, as shown in FIG. 9, the electric potential difference between the output signals OUT and bar OUT is generated, but the difference itself is diminutive.

By increasing the size of the NMOS transistors TA and TB, in order to bring the complementary output signal at the low electric potential side come closer to the electric potential of the low voltage power source GND, a high speed operation of the sense amplifier can be realized. However, the increase of the transistors size increases the size of the entire circuit and consequently, it would be difficult to integrate the circuit.

A plurality of sense amplifiers shown in FIG. 8 can be connected in series and provided in multiple steps, in order to generate large electric potential difference between the complementary output signals OUT and bar OUT. For example, the output signals OUT and bar OUT from the preceding sense amplifier can be inputted to the next sense amplifier, as its input signals IN and bar IN. However, if the circuit employs this configuration, the size of the circuit significantly increases. Therefore, there is a problem with integrating the large circuit. Further, the current keeps flowing in each sense amplifier, such that the power consumption further increases.

SUMMARY OF THE INVENTION

Accordingly, it is a primary objective of the present invention to provide a differential amplification circuit, which overcomes the forgoing problems, such that the differential amplification circuit has a reduced power consumption, and provides high amplification factor, and high speed operation capability.

To achieve the forgoing objects, the differential amplification circuit includes a first and second MOS transistors such that both transistors are similar conductive type transistors. The sources of the first and second MOS transistors are connected. A complementary input signal is inputted into each gate of the first and second MOS transistors, and a complementary output signal is outputted from each drain of the first and second MOS transistors. A switch circuit portion, which is controlled based on the complementary output signal from the MOS transistor, is connected between the source or drain of the first and second MOS transistors, and the connected source portion of the first and second MOS transistors.

BRIEF DESCRIPTION OF THE DRAWINGS

The features of the present invention that are believed to be novel are set forth with particularity in the appended claims. The invention, together with the objects and advantages thereof, may best be understood by reference to the following description of the preferred embodiments, together with the accompanying drawings, in which:

DETAILED DESCRIPTION OF THE PREFERRED EMBODIMENT

Figure 2:
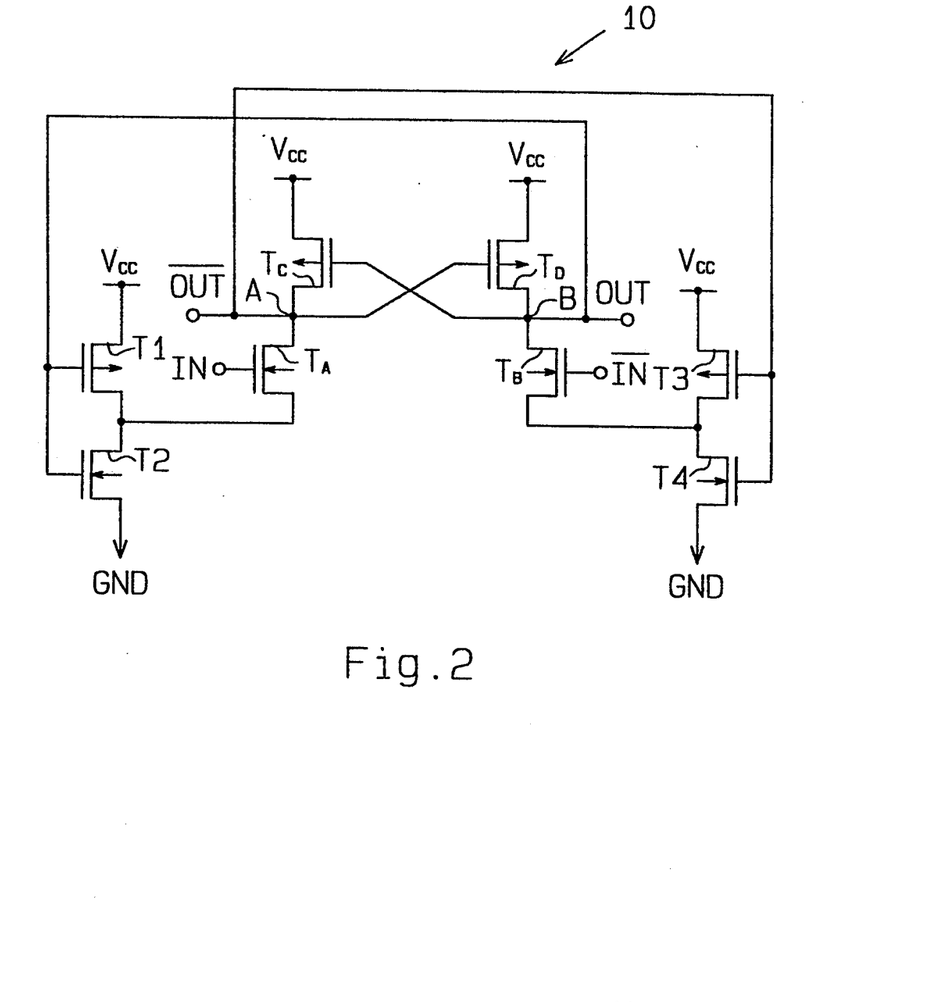
FIG. 2 is a circuit diagram of a latch type sense amplifier used in the RAM of FIG. 1.
Figure 3:
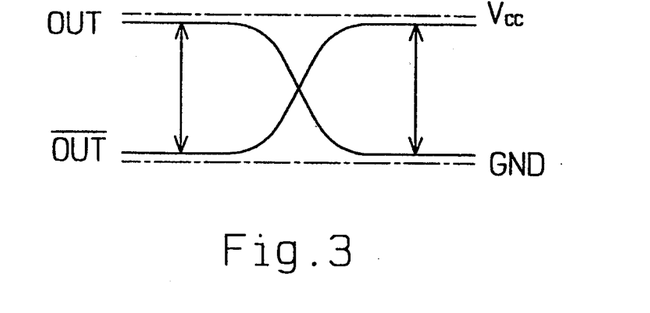
FIG. 3 illustrates output wave shapes that are outputted from the latch type sense amplifier of FIG. 2.

An embodiment of a differential amplification circuit according to the present invention will be explained in detail, with reference to FIGS. 1 through FIG. 3.

Figure 1:
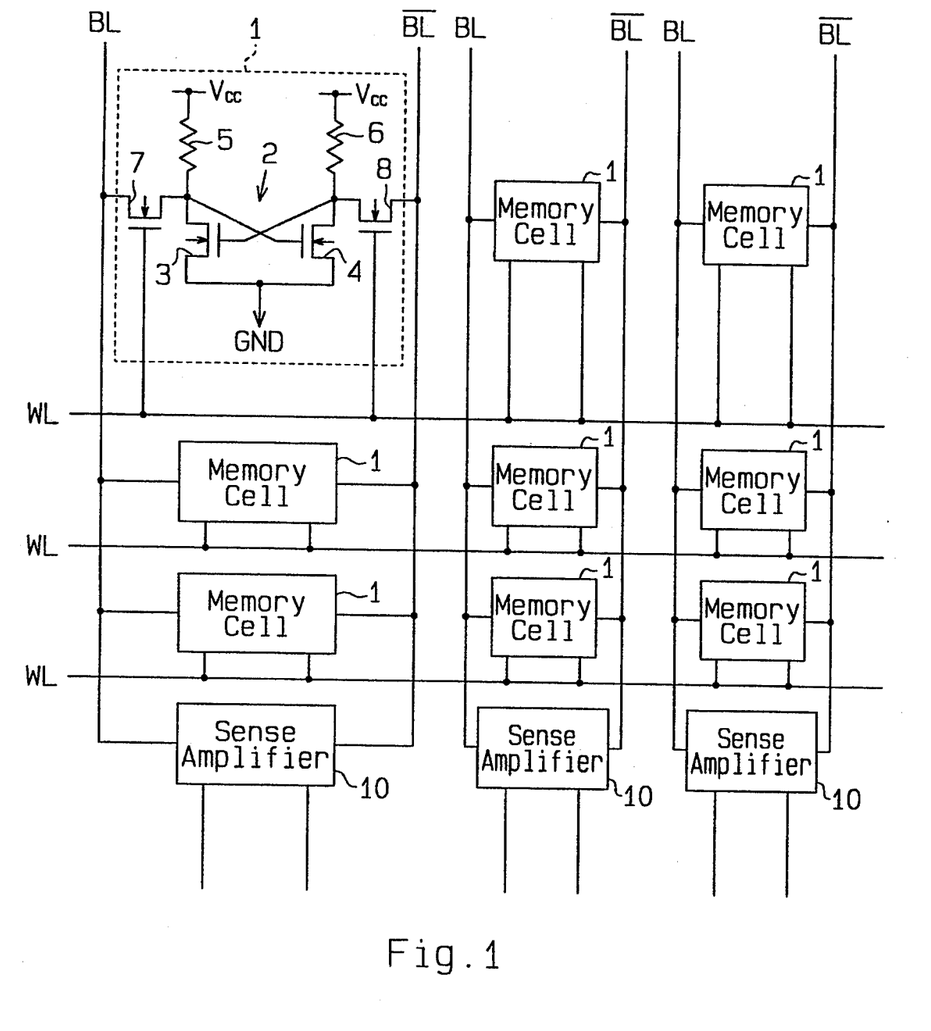
FIG. 1 is a block diagram of a static RAM according to an embodiment of the present invention.

FIG. 1 illustrates a static random access memory (RAM) which is formed with a plurality of metal oxide semiconductor (MOS) transistors. A memory cell 1 is electronically connected to paired bit lines BL and bar BL and a word line WL, which is provided at each block defined between paired bit lines BL and bar BL, and a plurality of word lines which generally perpendicularly intersect a plurality of paired bit lines BL and bar BL.

In a flip-flop circuit 2 of each memory cell 1, each cell transistor 3 and 4 is formed of an enhancement mode N-channel MOS transistor (hereinafter, referred to as NMOS). A gate of the transistor 3 is connected to a drain of the transistor 4, and vice versa, and a gate of the transistor 4 is connected to a drain of the transistor 3. The drain of each transistor 3 and 4 is respectively connected to a resistor 5 and 6, which acts as load. Each one of the transistors 3 and 4 is connected between a low voltage power source GND, and a high voltage power source Vcc. Each gate transistor 7 and 8, which is formed of NMOS transistors, is connected between the drain of the cell transistor 3 and the bit line BL, and between the drain of the cell transistor 4 and the bit line bar BL, respectively. Each gate of the gate transistors 7 and 8 is connected to the word line WL.

The distal ends of each one of the paired bit lines BL and bar BL, are connected to a corresponding senseamplifier 10. In the static RAM of this type, while one of the word lines WL is selected, a predetermined memory cell 1 can be selected by selecting either one pair of the paired bit lines BL and bar BL. Data stored in the selected memory cell 1 is outputted to the corresponding sense amplifier 10, via the selected paired bit lines BL and bar BL, to be amplified by that sense amplifier 10.

The sense amplifier 10 will now be described in detail. The sense amplifier 10 is a PMOS cross coupled type transistor. As shown in FIG. 2, the sense amplifier 10 is formed of a pair of enhancement mode N-channel MOS transistors (hereinafter, referred to as NMOS transistors) TA and TB, and a pair of enhancement mode P-channel MOS transistors (hereinafter, referred to as PMOS transistors) TC and TD. The drains of the NMOS transistors TA and TB are connected to the drains of the PMOS transistors TC and TD, respectively. The gates of the NMOS transistors TA and TB are connected to the bit lines BL and bar BL, respectively. Complimentary input signals IN and bar IN are to be inputted into the gates of the NMOS transistors TA and TB, respectively.

On the other hand, the gates of the paired PMOS transistors TC and TD are cross-coupled to the drains of the paired PMOS TD and TC, respectively. Each source of the transistors TD and TC is connected to the high voltage power source Vcc.

The drain of the NMOS transistor TB is connected to an inverter circuit which includes a CMOS transistor. This inverter circuit is formed of a PMOS transistor T1 and an NMOS transistor T2. The source of the PMOS transistor T1 is connected to the high voltage power source Vcc. The source of the NMOS transistor T2 is connected to the low voltage power source GND. Each gate of the PMOS transistor T1 and the NMOS transistor T2 is connected to the drain (node B) of the NMOS transistor TB. Each drain of the PMOS transistor T1 and the NMOS transistor T2 is connected to the source of the NMOS transistor TA.

On the other hand, the drain of the NMOS transistor TA is connected to an inverter circuit which includes the CMOS transistor. This inverter circuit is formed of an enhancement mode P-channel MOS transistor (PMOS) T3 and an enhancement mode N-channel MOS transistor (NMOS) T4. The source of the PMOS transistor T3 is connected to the high voltage power source Vcc. The source of the NMOS transistor T4 is connected to the low voltage power source GND. The source of the NMOS transistor TA is connected to the low voltage power source GND, via the NMOS transistor T2. The source of the NMOS transistor TB is connected to the lower voltage source GND, via the NMOS transistor T4. Each gate of the PMOS and NMOS transistors T3 and T4 is connected to the drain (node A) of the NMOS transistor TA. Each drain of the PMOS and NMOS transistors T3 and T4 is connected to the source of the NMOS transistor TB.

The operation of the foregoing sense amplifier will now be described.

A low voltage complementary input signal IN is inputted to the gate of the NMOS TA. A complementary input signal bar IN having a higher voltage than that of the signal IN is inputted to the gate of the transistor TB. The electric potential of the input signals IN and bar IN is higher than an individual threshold voltage $V_{th}$ of the NMOS transistors TA and TB.

Therefore, the conductance of the NMOS transistor TA is smaller than that of the NMOS transistor TB, such that the voltage of the node A (complementary output signal bar OUT) rises. When the voltage of the node A exceeds the threshold voltage $V_{th}$ of the NMOS transistor T4, the NMOS transistor T4 becomes conductive, and the source of the NMOS transistor TB becomes close to the electric potential of the low voltage power source GND. Further, the electric potential of the node B (complementary output signal OUT) becomes close to the electric potential of the low voltage power source GND.

On the other hand, since the electric potential of the node B becomes close to that of the low voltage power source GND, the NMOS transistor T2 becomes nonconductive, and the PMOS transistor T1 becomes conductive. The source of the NMOS transistor TA becomes close to the electric potential of the high voltage power source Vcc. As a result, the electric potential of the node A is stabilized at that of the high voltage power source Vcc, via the NMOS transistor TA. Furthermore, since the electric potential of the node A is stabilized, the PMOS transistor TD becomes non-conductive, and the electric potential of the node B becomes at the level of the low voltage power source GND, and is stabilized.

As described above, because the electric potential of each node A and B is stabilized, the NMOS and PMOS transistors T2 and TD become non-conductive. Therefore, the current consumption by the sense amplifier becomes zero. Furthermore, as shown in FIG. 3, the electric potential of the node A (output signal bar OUT) becomes that of the high voltage power source Vcc, and the electric potential of the node B (output signal OUT) becomes that of the low voltage power source GND. As a result, the potential difference between the output signal OUT and the output signal bar OUT significantly increases, and the amplification factor of the sense amplifier increases.

On the other hand, as a high voltage input signal IN is inputted to the gate of the NMOS transistor TA, and a low voltage input signal bar IN is inputted to the gate of the NMOS transistor TB, the electric potential of each node A and B becomes stabilized, such that the NMOS and PMOS transistors T4 and TC, respectively, become non-conductive. Therefore, the current consumption of the sense amplifier becomes zero. The electric potential of the node A (complimentary output signal bar OUT) becomes the electric potential level of the low voltage power source GND, and the electric potential of the node B (output signal OUT) becomes that of the high voltage power source Vcc. As a result, the potential difference between the output signals OUT and bar OUT significantly increases.

In this way, according to this embodiment, when the sense amplifier is stabilized, current will not flow therein, and power consumption is reduced. Furthermore, this sense amplifier has a large amplification factor, and causes the potential difference between the complementary output signals OUT and bar OUT to increase. There is no need to connect a plurality of sense amplifiers in series to form multiple stages, in order to increase the amplification factor, as is the case with conventional devices. Therefore, high speed operation to the static RAM can be realized.

Although only one embodiment of the present invention has been described herein, it should be apparent to those skilled in the art that the present invention may be embodied in many other specific forms without departing from the spirit or scope of the invention.

Particularly, it should be understood that the following modes could be used. The elements similar to those in the above embodiment are given similar reference numerals, and the explanation of these elements is partly omitted.

Figure 4:
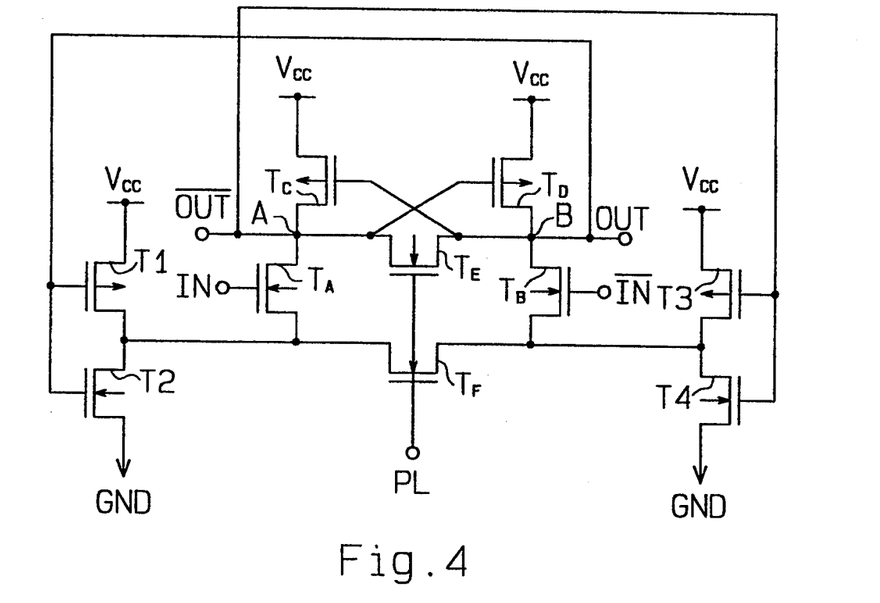
FIG. 4 is a circuit diagram of another latch type sense amplifier.

(1) In the sense amplifier shown in FIG. 4, short circuiting transistors TE and TF including NMOS transistors are connected between the nodes A and B, and between the NMOS transistors TA and TB, respectively. Equalization signals PL are applied to each gate of the short circuiting transistors TE and TF, from the outside. When the equalization signal PL, having a high electric potential, is inputted to the short circuiting transistors TE and TF, the circuits between the nodes A and B, and between the NMOS transistors TA and TB become shorted.

Figure 5:
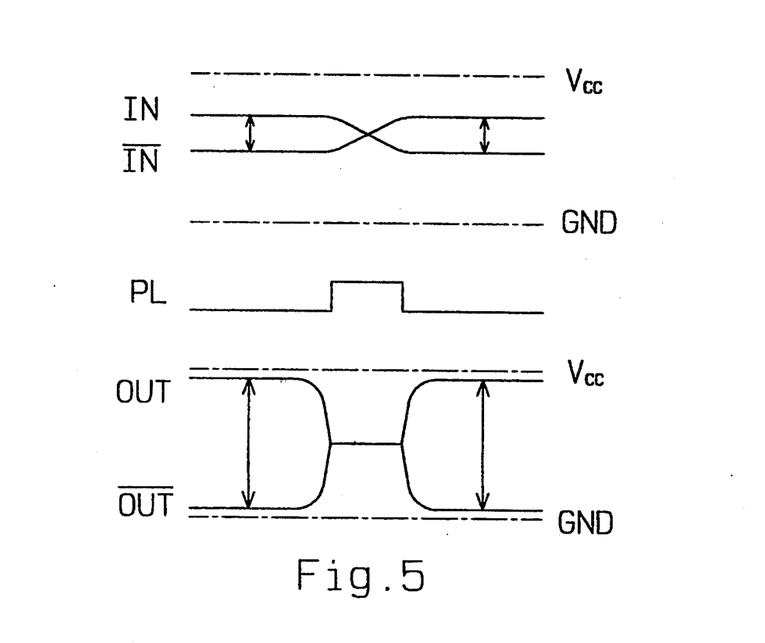
FIG. 5 illustrates input and output wave shapes from the latch type sense amplifier of FIG. 4.

More specifically, as shown in FIG. 5, as another memory cell 1 is to be selected by changing a designated address, the electric potential of the complementary input signals IN and bar IN are transmitted via the paired bit lines BL and bar BL, are switched. During this switching period, the equalization signal PL, having a high electric potential, is inputted, to make the short circuiting transistors TE and TF conductive, and to further short the circuits between the nodes A and B, and between the sources of the NMOS transistors TA and TB. As a result, as shown in FIG. 5, the electric potential between the nodes A and B, and between the NMOS transistors TA and TB becomes equipotential. Therefore, the rise time and the fall time of the complementary output signals OUT and bar OUT become equal. As a result, the logic circuits that are connected to the next sense amplifier, in which the complementary output signals OUT and bar OUT are inputted, can minimize the operation time, so as to realize high speed operation. Further, when the complementary input signals IN and bar IN are inverted, the complementary output signals OUT and bar OUT are also securely inverted.

Figure 6:
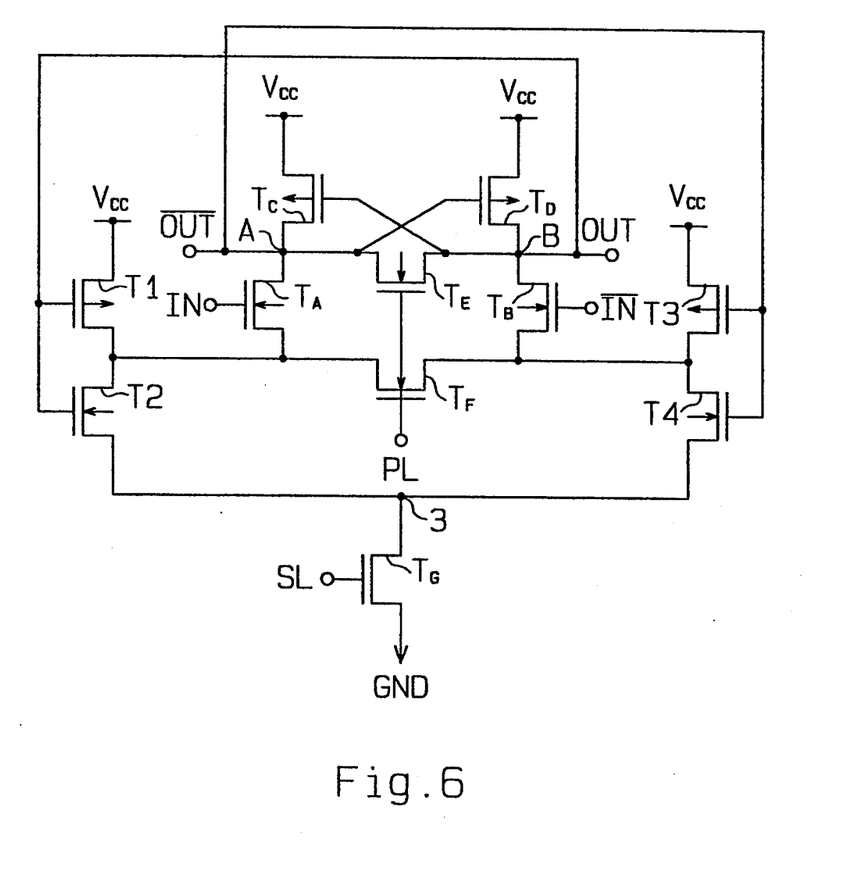
FIG. 6 is a circuit diagram of yet another latch type sense amplifier.

(2) The sense amplifier shown in FIG. 6 includes the transistors T2 and T4, which are connected to the source, in addition to the sense amplifier shown in FIG. 4. A gate transistor TG formed of NMOS transistors is provided between the connecting point of the NMOS transistors T2 and T4, and the low voltage power source GND. A select signal SL is inputted to the gate of the gate transistor TG from the outside. When the select signal SL, having high electric potential, is inputted the gate transistor TG, the transistor TG becomes conductive. Therefore, this senseamplifier becomes active. When the select signal SL, having low electric potential, is inputted to the gate transistor TG, the transistor TG becomes non-conductive. Therefore, this senseamplifier becomes non-operative, so as to reduce the power consumption.

Figure 7:
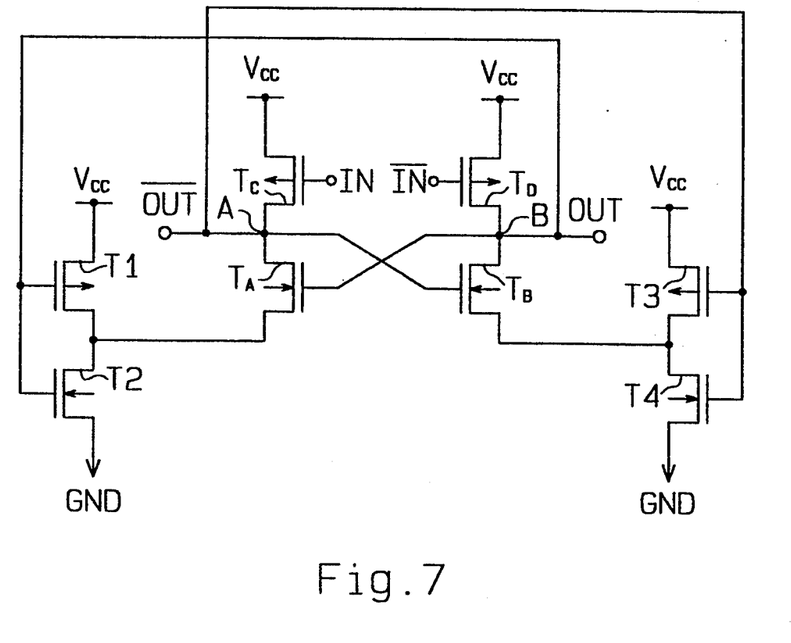
FIG. 7 is a circuit diagram of a latch type sense amplifier according to another embodiment.

(3) In the sense amplifier shown in FIG. 7, each drain of the NMOS transistors TA and TB is connected to the drain of the PMOS transistors TC and TD, respectively. Each gate of the NMOS transistors TA and TB is cross coupled to the drain of the PMOS transistors TD and TC, respectively.

On the other hand, each source of the paired PMOS transistors TC and TD is connected to the high voltage power source Vcc. Therefore, the PMOS transistors TC and TD are connected to the source. The gates of the PMOS transistors TC and TD are connected to the bit lines BL and bar BL, respectively. The complementary input signals IN and bar IN are inputted to the gates of the PMOS transistors TC and TD.

In the foregoing sense amplifier, the input signal IN, having low electric potential, is fed to the gate of the PMOS transistor TC, and the input signal bar IN, having a voltage higher than the signal IN, is inputted into the gate of the PMOS transistor TD. The electric potential of the input signals IN and bar IN is lower than the individual threshold voltage $V_{th}$ of the PMOS transistors TC and TD.

Therefore, the conductance of the PMOS transistor TC is larger than that of the PMOS transistor TD, such that the electric potential of the node A (output signal bar OUT) increases. When the electric potential exceeds the threshold voltage of the NOMS transistor T4, the electric potential of the source of the NMOS transistor TB becomes close to the electric potential level of the low voltage power source GND, as the NMOS transistor T4 is conductive. Further, the electric potential of the node B (output signal bar OUT) decreases such that the electric potential of the node B (output signal OUT) becomes close to the electric potential level of the low voltage power source GND, via the NMOS transistor TB.

On the other hand, since the electric potential of the node B becomes close to the electric potential level of the low voltage power source GND, the NMOS transistor T2 becomes non-conductive, and the PMOS transistor T1 becomes conductive, and also the NMOS transistor T2 becomes non-conductive. Therefore, the source of the NMOS transistor TA becomes close to the electric potential of the high voltage power source Vcc. As a result, the electric potential of the node A becomes stabilized at the electric potential level of the high voltage power source Vcc, via the PMOS transistor TC. Since the electric potential of the node A becomes close to the electric potential level of the high voltage power source Vcc and is stabilized, the electric potential of the node B becomes close to the electric potential level of the low voltage power source GND and is also stabilized, via the NMOS transistor T4.

As described above, when the electric potential of each node A and B becomes stabilized, the difference of the electric potential between the output signals OUT and bar OUT increases significantly, and the amplification factor of the sense amplifier also increases.

On the other hand, if the input signal IN, having high electric potential, is fed to the gate of the PMOS transistor TC, and the input signal bar IN, having low electric, potential is fed to the gate of the PMOS transistor TD, the electric potential of each input signal IN and bar IN is lower than the individual threshold voltage $V_{th}$ of the PMOS transistors TC and TD.

In this case, when the electric potential of each node A and B becomes stabilized, the electric potential of the node A (output signal bar OUT) becomes the electric potential level of the low voltage power source GND, and the electric potential of the node B (output signal OUT) becomes the electric potential level of the high voltage source Vcc. As a result, the electric potential difference between the output signals OUT and bar OUT increases significantly.

In each above-described embodiment, the switch circuit includes the inverter circuit which is formed of the PMOS and NMOS transistors T1 and T2, and the inverter circuit which is formed of the PMOS and NMOS transistors T3 and T4. The switch circuit can be formed of only the NMOS transistors T2 and T4, without the PMOS transistors. Further, pull-up resistance can be employed, in replacing the PMOS transistors T1 and T2.

Furthermore, in each one of the foregoing embodiments, a latch type sense amplifier has been described as the differential amplification circuit. A current mirror type sense amplifier, etc., can be applied to the differential amplification circuit, etc. Furthermore, the differential amplification circuit including bi-CMOS constitution can be used instead of the MOS transistors.

What is claimed is:

1. A differential amplification circuit comprising:
   a first N-channel MOS transistors having a source terminal, a drain terminal for outputting a first output signal, and a gate for receiving a first input signal;
   a second N-channel MOS transistor having a source terminal, a drain terminal for outputting a second output signal complementary to said first output signal, and a gate terminal for receiving a second input signal complementary to said first input signal;
   first switch means for connecting said source terminal of said first N-channel MOS transistor to a common potential point, in response to said second output signal; and
   second switch means for connecting said source terminal of said second N-channel MOS transistor to said common potential point, in response to said first output signal.

2. The differential amplification circuit according to claim 1, wherein said first and second switch means are similar in structure and function.

3. The differential amplification circuit according to claim 2, wherein when said first switch means connects the source of said first N-channel MOS transistor to said common potential point, said second switch means disconnects the source of said second N-channel MOS transistor from said common potential point, and wherein when said second switch means connects the source of said second N-channel MOS transistor to said common potential point, said first switch means disconnects the source of said first N-channel MOS transistor with said common potential point.

4. The differential amplification circuit according to claim 1, wherein the differential amplification circuit is a latch type sense amplifier further comprising:
   first and second P-channel MOS transistors, each having a drain, a source and a gate; and
   wherein the drains of said first and second N-channel MOS transistors are connected to the drains of said first and second P-channel MOS transistors, respectively, and the gates of said first and second P-channel MOS transistors are cross coupled to the drains of said second and first N-channel MOS transistors, respectively.

5. The differential amplification circuit according to claim 1, wherein said switch means comprises an inverter circuit which includes third and fourth P-channel MOS transistors and third and fourth P-channel MOS transistors and third and fourth N-channel MOS transistors, each of which includes a source, a drain and a gate; and
   wherein the sources of said third and fourth N-channel MOS transistors are interconnected, the drains of said third and fourth N-channel MOS transistors are connected to the sources of said first and second N-channel MOS transistors, respectively, and said complementary output signals are inputted to at least some of the gates of said inverter circuit.

6. The differential amplification circuit according to claim 5, further comprising:
   first and second short circuiting transistors connected between the sources of said first and second N-channel MOS transistors, and connected between the drains of said first and second N-channel MOS transistors, respectively, to cause a short therebetween.

7. The differential amplification circuit according to claim 6, wherein said first and second short circuiting transistors are NMOS transistors.

8. The differential amplification circuit according to claim 5, wherein each source of said third and fourth N-channel MOS transistors is connected to a gate transistor, for connection to a power source.

9. The differential amplification circuit according to claim 6, wherein each source of said third and fourth N-channel MOS transistors is connected to a gate transistor, for connection to a power source.

10. A differential amplification circuit comprising:
a first P-channel MOS transistor having a source terminal, a drain terminal for outputting a first output signal, and a gate terminal for receiving only a first input signal;
a second P-channel MOS transistor having a source terminal, a drain terminal for outputting a second output signal complementary to said first output signal, and a gate terminal for receiving only a second input signal;
first switch means for connecting said drain terminal of said first P-channel MOS transistor to a common potential point, in response to said second output signal; and
said second switch means for connecting said drain terminal of said second P-channel MOS transistor to said common potential point, in response to said first output signal.

11. The differential amplification circuit according to claim 10, further comprising:
first and second N-channel MOS transistors; and
a latch type sense amplifier,
wherein the drains of said first and second P-channel MOS transistors are connected to drains of said first and second N-channel MOS transistors, respectively; and
wherein gates of said first and second N-channel MOS transistors are cross coupled to the gates of said second and first P-channel MOS transistors.

12. The differential amplification circuit according to claim 11, wherein said first and second switch means comprise:
a CMOS type inverter including third and fourth P-channel MOS transistors and third and fourth N-channel MOS transistors each including a source, a gate and a drain;
wherein the sources of said third and fourth N-channel MOS transistors are interconnected; and
wherein the drains of said third and fourth N-channel MOS transistors are connected to the sources of said first and second N-channel MOS transistors, respectively.

* * * * *

UNITED STATES PATENT AND TRADEMARK OFFICE
CERTIFICATE OF CORRECTION

PATENT NO. : 5,345,121
DATED : September 6, 1994
INVENTOR(S) : Eisaku ITOH

It is certified that error appears in the above-indentified patent and that said Letters Patent is hereby corrected as shown below:

Column 3, line 53, change "senseam-" to --sense am---.

Column 6, line 36, change "senseamplifier" to --sense amplifier--; and line 40, change "senseamplifier" to --sense amplifier--.

Signed and Sealed this

Twenty-eight Day of February, 1995

Attest:

BRUCE LEHMAN

Attesting Officer     Commissioner of Patents and Trademarks